(12) United States Patent
Marsh et al.

(10) Patent No.: US 9,496,491 B2
(45) Date of Patent: Nov. 15, 2016

(54) METHODS OF FORMING A METAL CHALCOGENIDE MATERIAL AND RELATED METHODS OF FORMING A MEMORY CELL

(75) Inventors: Eugene P. Marsh, Boise, ID (US); Stefan Uhlenbrock, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 629 days.

(21) Appl. No.: 13/476,186

(22) Filed: May 21, 2012

(65) Prior Publication Data

US 2013/0306927 A1 Nov. 21, 2013

(51) Int. Cl.
*H01L 21/02* (2006.01)
*H01L 45/00* (2006.01)

(52) U.S. Cl.
CPC ........... *H01L 45/06* (2013.01); *H01L 21/0228* (2013.01); *H01L 21/02175* (2013.01); *H01L 45/085* (2013.01); *H01L 45/1233* (2013.01); *H01L 45/1266* (2013.01); *H01L 45/144* (2013.01); *H01L 45/1616* (2013.01)

(58) Field of Classification Search
CPC ....... C01B 25/14; C01B 19/04; C01B 35/14; C01B 21/082; H01L 21/02
See application file for complete search history.

(56) References Cited

U.S. PATENT DOCUMENTS

| | | | |
|---|---|---|---|
| 7,608,539 B2 | 10/2009 | Sneh | |
| 7,964,746 B2 | 6/2011 | Chen et al. | |
| 8,053,861 B2 | 11/2011 | Mountsier et al. | |
| 8,426,839 B1* | 4/2013 | Ma | H01L 45/085 257/3 |
| 2009/0275198 A1* | 11/2009 | Kamepalli | H01L 45/06 438/659 |
| 2010/0009078 A1 | 1/2010 | Pore et al. | |
| 2011/0031466 A1* | 2/2011 | Kagawa | H01L 45/06 257/5 |
| 2011/0180775 A1* | 7/2011 | Lin et al. | 257/4 |
| 2011/0262660 A1 | 10/2011 | Ishii et al. | |

OTHER PUBLICATIONS

Kim et al., Structural Properties of Ge2Sb2Te5 Thin Films by Metal Organic Chemical Vapor Deposition for Phase Change Memory Applications, Applied Physics Letters, vol. 89 (2006) pp. 102107-1-102107-3.
Pessa et al., Characterization of Surface Exchange Reactions Used to Grow Compound Films, Appl. Phys. Lett. vol. 38, No. 3, Feb. 1981, pp. 131-132.
Pore et al., Atomic Layer Deposition of Metal Tellurides and Selenides Using Alkysilyl Compounds of Tellurium and Selenium, J. Am. Chem. Soc., vol. 131, No. 10 (2009), pp. 3478-3480.

* cited by examiner

*Primary Examiner* — Tran Tran
(74) *Attorney, Agent, or Firm* — TraskBritt

(57) ABSTRACT

A method of forming a metal chalcogenide material. The method comprises introducing a metal precursor and a chalcogenide precursor into a chamber, and reacting the metal precursor and the chalcogenide precursor to form a metal chalcogenide material on a substrate. The metal precursor is a carboxylate of an alkali metal, an alkaline earth metal, a transition metal, a post-transition metal, or a metalloid. The chalcogenide precursor is a hydride, alkyl, or aryl precursor of sulfur, selenium, or tellurium or a silylhydride, silylalkyl, or silylaryl precursor of sulfur, selenium, or tellurium. Methods of forming a memory cell including the metal chalcogenide material are also disclosed, as are memory cells including the metal chalcogenide material.

24 Claims, 3 Drawing Sheets

METHODS OF FORMING A METAL CHALCOGENIDE MATERIAL AND RELATED METHODS OF FORMING A MEMORY CELL

FIELD

The present disclosure, in various embodiments, relates generally to the field of semiconductor device design and fabrication. More specifically, the present disclosure relates to a method of forming a metal chalcogenide material, and to methods of forming memory cells.

BACKGROUND

Over the past few decades, there has been interest in chalcogenide materials for use in semiconductor devices, such as solar cells, photodetectors, or electroconductive electrodes. One such chalcogenide material is copper telluride (CuTe), which has been investigated for use as a cell material in conductive bridge random access memory (conductive bridge RAM) and phase change random access memory (PCRAM). One of the current difficulties associated with CuTe is the deposition of this material. CuTe is conventionally formed by a physical vapor deposition (PVD) or chemical vapor deposition (CVD) process, or by codeposition of copper and tellurium onto a surface within an evacuated chamber. However, due to the equipment and targets needed, these techniques are expensive and take a considerable amount of time to become production worthy.

Atomic layer deposition (ALD) of chalcogenide materials, such as certain metal tellurides or certain metal selenides, has been investigated. Alkylsilyl tellurides and alkylsilyl selenides have been reacted with metal halides to form metal tellurides or metal selenides, such as SbTe ($Sb_2Te_3$), GeTe, GeSbTe, ZnTe, BiTe ($Bi_2Te_3$), ZnSe, BiSe ($Bi_2Se_3$), InSe ($In_2Se_3$), or CuSe ($Cu_2Se$). Alkylsilyl selenides, such as bis(triethylsilyl) selenide, have also been reacted with copper(II) pivalate to form CuSe, $Cu_{2-x}Se$, and $Cu_2Se$. However, ALD processes for forming chalcogenide materials are limited by the availability, reactivity, and toxicity of appropriate ALD precursors.

It would be desirable to form additional chalcogenide materials, such as CuTe, by ALD processes.

DETAILED DESCRIPTION

Figure 1:
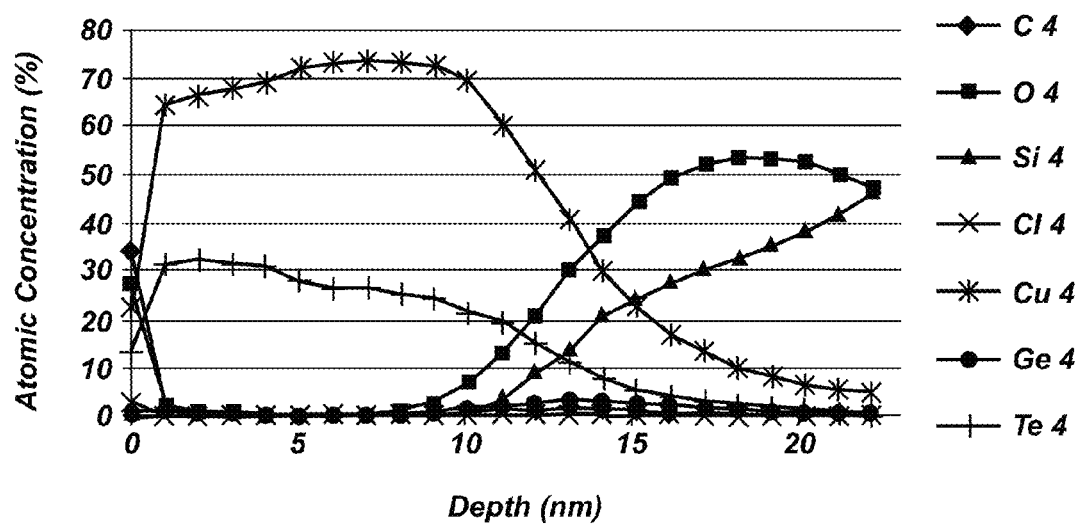
FIG. 1 is an x-ray photoelectron spectroscopy (XPS) depth profile for a metal chalcogenide material formed by an embodiment of the present disclosure.

Methods of forming a metal chalcogenide material by atomic layer deposition (ALD) are described. As used herein, the terms "atomic layer deposition" or "ALD" mean and include a vapor deposition process in which a plurality of separate deposition cycles are conducted in a chamber. The term "atomic layer deposition," as used herein, includes "atomic layer epitaxy" (ALE), molecular beam epitaxy (MBE), gas source MBE, organometallic MBE, and chemical beam epitaxy when performed with alternating pulses of precursor compound(s) and purge (i.e., inert) gas. During each deposition cycle of the ALD process, a metal precursor is chemisorbed to a substrate surface, excess metal precursor is purged out of the chamber, a subsequent chalcogenide precursor is introduced to react with the chemisorbed metal, and excess reaction gas and byproducts are removed from the chamber. By repeating the deposition and purge acts, the metal chalcogenide material is formed by ALD.

The metal chalcogenide material formed by the ALD process may be a compound of the metal (i.e., an alkali metal, an alkaline earth metal, a transition metal, a post-transition metal, or a metalloid), and sulfur, selenium, or tellurium as the chalcogen. The metal chalcogenide material may include, but is not limited to, antimony sulfide (SbS), antimony selenide (SbSe), germanium sulfide (GeS), germanium selenide (GeSe), zinc sulfide (ZnS), bismuth sulfide (BiS), indium sulfide (InS), indium telluride (InTe), copper sulfide (CuS), copper telluride (CuTe), silver sulfide (AgS), silver selenide (AgSe), silver telluride (AgTe), gold sulfide (AuS), gold selenide (AuSe), or gold telluride (AuTe). In some embodiments, the metal chalcogenide material is CuTe. For convenience and simplicity, the specific metal chalcogenide materials listed herein indicate compounds that include the listed elements. The specific metal chalcogenide materials do not necessarily reflect the stoichiometry of the listed elements. Instead, the specific metal chalcogenide materials may be a stoichiometric or non-stoichiometric compound that includes the listed elements. For example, the term "CuTe" indicates a stoichiometric or non-stoichiometric compound of copper and tellurium and may include, but is not limited to, CuTe, $CuTe_4$, $Cu_2Te$, $Cu_3Te_2$, $Cu_4Te_3$, $Cu_7Te_4$, or $Cu_7Te_5$. The metal chalcogenide material may, optionally, include additional element(s) as described below.

The metal chalcogenide material formed by some embodiments of the present disclosure does not include the following metal chalcogenide materials: SbTe, GeTe, GeSbTe, ZnTe, BiTe, ZnSe, BiSe, InSe, and CuSe.

The following description provides specific details, such as material types and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

The illustrations presented herein are not meant to be actual views of any particular semiconductor structure, but are merely idealized representations which are employed to describe the present invention. The figures are not necessarily drawn to scale. Additionally, elements common between figures may retain the same numerical designation.

The metal chalcogenide material may be formed by the ALD process on a surface of the substrate. As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, structures, or regions formed thereon. Previous process acts may have been conducted to form materials, regions, or junctions in the base semiconductor structure or foundation. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of example, the substrate may be silicon, silicon dioxide, silicon with native oxide, glass, semiconductor, metal oxide, metal, titanium nitride (TiN), a tantalum nitride (TaN$_x$), titanium (Ti), tantalum (Ta), niobium (Nb), a niobium nitride (NbN$_x$), a molybdenum nitride (MoN$_x$), molybdenum (Mo), a tungsten nitride (WN$_x$), copper (Cu), cobalt (Co), nickel (Ni), iron (Fe), aluminum (Al), or a noble metal.

The ALD process may be performed by conducting alternating pulses of the metal precursor and the chalcogenide precursor, with intervening pulses of an inert gas. The inert gas may be nitrogen (N$_2$), argon (Ar), helium (He), neon (Ne), krypton (Kr), xenon (Xe), or other gases that, although not inert, behave as inert under the conditions of the deposition of the precursors. The metal precursor and the chalcogenide precursor may function as a source of the metal and chalcogen, respectively, of the metal chalcogenide material. The metal and chalcogen, which are formed on the substrate, may be reacted to form the metal chalcogenide material. Each of the metal precursor and the chalcogenide precursor may be solid, liquid, or gaseous at room temperature and atmospheric pressure. If the precursors are in a solid or liquid form at room temperature and atmospheric pressure, the precursors may be vaporized before introduction into the chamber. Vaporization of the precursors may be accomplished by conventional techniques, which are not described in detail herein. The precursors may be commercially available or synthesized by conventional techniques.

The metal precursor may be an organometallic compound that includes a complex of the metal and a ligand. The metal may be an alkali metal, an alkaline earth metal, a transition metal, a post-transition metal, or a metalloid, such as antimony (Sb), bismuth (Bi), copper (Cu), gallium (Ga), germanium (Ge), gold (Au), indium (In), lead (Pb), nickel (Ni), palladium (Pd), silver (Ag), tin (Sn), or zinc (Zn). In some embodiments, the metal is copper. The ligand may be a carboxylate group having the chemical formula R$^4$C(O)O$^-$, where R$^4$ is an alkyl group having less than or equal to eight carbon atoms. The R$^4$ group may include, but is not limited to, a methyl, ethyl, propyl (n-propyl or iso-propyl), butyl (n-butyl, sec-butyl, iso-butyl, tert-butyl), pentyl, hexyl, heptyl, or octyl group. The ligand may include, but is not limited to, acetate, propionate, butyrate, isobutyrate, valerate, pivalate (trimethylacetate), or hexanoate. The ligand may also be a carboxylate similar to the pivalate group except in which one methyl group, two methyl groups, or three methyl groups on the tertiary carbon are replaced with one ethyl group, two ethyl groups, or three ethyl groups, respectively. In some embodiments, the ligand is pivalate. In some embodiments, the metal precursor is copper(II) pivalate.

The chalcogenide precursor may be a hydride precursor of the chalcogen, an alkyl precursor of the chalcogen, or an aryl precursor of the chalcogen, or a silylhydride precursor of the chalcogen, a silylalkyl precursor of the chalcogen, or a silylaryl precursor of the chalcogen, such as an alkyl precursor or a silylalkyl precursor of selenium or of tellurium. The chalcogenide precursor may have a chemical formula of Te(R$^1$R$^2$) or Se(R$^1$R$^2$), where each of R$^1$ and R$^2$ is independently hydrogen, an alkyl group having between two carbon atoms and four carbon atoms, or an aryl group. The alkyl group may be saturated or unsaturated and may include heteroaroms, such as oxygen, nitrogen, or sulfur. Thus, each of R$^1$ and R$^2$ may be an alkenyl, alkynyl, or alkoxide group. The aryl group may be a phenyl group, a substituted phenyl group, or a heteroatom-containing group, such as a nitrogen-containing group or a sulfur-containing group. Each of R$^1$ and R$^2$ may be independently selected so that the chalcogenide precursor exhibits desired properties, such as reactivity, volatility, and toxicity, for use in the ALD process. The chalcogenide precursor may have a chemical formula of Te(SiR$^3$R$^4$R$^5$)$_2$ or Se(SiR$^3$R$^4$R$^5$)$_2$, where each of R$^3$, R$^4$, and R$^5$ is independently hydrogen, an alkyl group having between one carbon atom and six carbon atoms, or an aryl group. The aryl group may be a phenyl group, a substituted phenyl group, or a heteroatom-containing group, such as a nitrogen-containing group or a sulfur-containing group. The alkyl group may be saturated or unsaturated and may include heteroaroms, such as oxygen, nitrogen, or sulfur. Thus, each of R$^3$, R$^4$, and R$^5$ may be an alkenyl, alkynyl, or alkoxide group. Each R$^3$, R$^4$, and R$^5$ may be independently selected so that the chalcogenide precursor exhibits desired properties, such as reactivity, volatility, and toxicity, for use in the ALD process. The chalcogenide precursor and the metal precursor may be selected to exhibit sufficient reactivity with one another to form the metal chalcogenide material on the substrate. In some embodiments, the chalcogenide precursor is a bis(trialkylsilyl) telluride, such as bis(trimethylsilyl) telluride, bis(triethylsilyl) telluride, bis(diethylmethylsilyl) telluride, or bis(dimethylethylsilyl) telluride. In other embodiments, the chalcogenide precursor is a dialkyl telluride, such as diethyl telluride, diisopropyl telluride, dibutyl telluride, or bis(t-butyl) telluride.

Selection of the chalcogenide precursor may depend on the temperature at which the ALD process is to be conducted. By way of example, an alkyl precursor may be used when the ALD process is to be conducted at a temperature of from about 200° C. to about 325° C., while a silylalkyl precursor may be used when the ALD process is to be conducted at a lower temperature, such as a temperature of from about room temperature (20° C.-25° C.) to about 275° C. In addition to reactivity and volatility considerations, the temperature at which the ALD process is conducted may depend on the thermal budget of a semiconductor structure in which the metal chalcogenide material is to be used. To prevent damage to other components of the semiconductor structure, the other components formed on or in the substrate should be compatible with the conditions of the ALD process. By utilizing the hydride, alkyl, or aryl precursor of sulfur, selenium, or tellurium or the silylhydride, silylalkyl, or silylaryl precursor of sulfur, selenium, or tellurium as the chalcogenide precursor, the ALD process for forming the metal chalcogenide material may be conducted across a wider temperature range than an ALD process utilizing conventional precursors.

While some alkyl precursors of selenium and tellurium have been used in conventional CVD processes, alkyl precursors of selenium or of tellurium have not been used as precursors in ALD processes due to their reduced reactivity and concerns with toxicity. Therefore, the ability to use alkyl precursors of selenium or of tellurium in ALD processes of the present disclosure was unexpected.

To form the metal chalcogenide material, the precursors (i.e., the metal precursor and the chalcogenide precursor) may be vaporized and sequentially deposited/chemisorbed to form a plurality of monolayers of the metal and the chalcogen on the substrate. Each monolayer of the metal and the chalcogen may be sequentially formed by separately introducing the metal precursor and the chalcogenide precursor to an exposed surface of the substrate. To form the metal chalcogenide material, each of the precursors may be introduced to the substrate under conditions that enable metal from the metal precursor or chalcogen from the chalcogenide precursor to chemisorb to the substrate, or to react with metal or chalcogen previously chemisorbed on the substrate. Each of the metal of the metal precursor and the chalcogen of the chalcogenide precursor function as a reactant for the other and eliminate silicon-containing groups during the ALD process. By appropriately selecting the reactivities of the metal precursor and the chalcogenide precursor, the ligand exchange reaction of the metal precursor and the chalcogenide precursor is thermodynamically favorable, enabling formation of the metal chalcogenide material by an ALD process at a low temperature, such as at about room temperature. Since the reaction is thermodynamically favorable, the reaction may proceed to completion, which enables the metal chalcogenide material to be formed with low amounts of impurities. The metal chalcogenide material may be greater than about 99% pure. Since the reaction is thermodynamically favorable, the metal chalcogenide material may be formed without the addition of heat, i.e., at room temperature.

To deposit the metal chalcogenide material on the substrate, a work piece including the substrate may be placed into a chamber (or may remain in the chamber from previous processing). The chamber may be a conventional ALD reactor, examples of which are known in the art and, therefore, are not described in detail herein. The metal precursor may be introduced into the chamber and may chemisorb to a surface of the substrate. For the sake of simplicity, the precursors (i.e., the metal precursor and the chalcogenide precursor) are described as being exposed to the substrate in a particular order. However, the precursors may be exposed to the substrate in any order. The metal precursor may be of sufficient volatility and reactivity to adsorb onto or react with the surface of the substrate. The metal precursor may be introduced into the chamber with the inert gas to form a mixture of the metal precursor and the inert gas. The metal precursor may be introduced into the chamber for an amount of time sufficient for the adsorption or reaction to occur, such as from about 0.1 second to about 30 seconds. The metal precursor may be introduced into the chamber at a flow rate of between about 1 sccm and about 100 sccm, a temperature of between about 20° C. and about 400° C., and a pressure of between about 0.0005 Torr and about 1 Torr. A monolayer of the metal may be formed on the surface of the substrate due to the chemisorption of the metal precursor on the surface of substrate. The monolayer formed by chemisorption of the metal precursor may be self-terminated since a surface of the monolayer may be non-reactive with the metal precursor used in forming the monolayer.

Subsequent pulsing with the inert gas removes excess metal precursor from the chamber, specifically the metal precursor that has not chemisorbed to the surface of the substrate. Purging the chamber also removes volatile by-products produced during the ALD process. The inert gas may be introduced into the chamber, for example, for from about 5 seconds to about 120 seconds. After purging, the chamber may be evacuated, or "pumped," to remove gases, such as excess precursor or volatile by-products. For example, the metal precursor may be purged from the chamber by techniques including, but not limited to, contacting the substrate with the inert gas and/or lowering the pressure in the chamber to below the deposition pressure of the metal precursor to reduce the concentration of the metal precursor contacting the substrate and/or chemisorbed species. A suitable amount of purging to remove the excess metal precursor and the volatile by-products may be determined experimentally, as known to those of ordinary skill in the art. The pump and purge sequences may be repeated multiple times.

After purging, the chalcogenide precursor may be introduced into the chamber and may chemisorb to exposed surfaces of the monolayer of metal. The chalcogenide precursor may be of sufficient volatility and reactivity to adsorb onto or react with the metal. The chalcogenide precursor may be introduced into the chamber for an amount of time sufficient for the adsorption or reaction to occur, such as from about 0.1 second to about 30 seconds. For example, the chalcogenide precursor may be introduced into the chamber at a flow rate of between about 1 sccm and about 100 sccm, a temperature of between about 20° C. and about 400° C., and a pressure of between about 0.0005 Torr and about 1 Torr. Reaction byproducts and the excess chalcogenide precursor may be removed from the chamber utilizing the pump and purge cycle as described above. The chalcogen formation and purging may be repeated any number of times to form a monolayer of chalcogen over the chemisorbed metal. For example, the chalcogen formation and purging may be repeated in sequence from about two times to about five times to form the monolayer of chalcogen of a desired thickness.

The resulting metal chalcogenide material may be a glassy material that includes the metal and the chalcogen and in which the metal and the chalcogen are bonded to one another. The metal chalcogenide material may be amorphous or crystalline as formed. By forming the metal chalcogenide material by ALD, the metal chalcogenide material may be formed conformally. In one embodiment, the metal chalcogenide material includes microsegregated areas of the metal and the chalcogen. In another embodiment, the metal chalcogenide material includes a greater proportion of the metal relative to the chalcogen. Thus, the metal chalcogenide material may be characterized as "rich" in the metal. The resulting metal chalcogenide material may have a high purity, with low amounts of impurities, such as carbon and oxygen impurities. The as-formed metal chalcogenide material may be substantially smooth, enabling the metal chalcogenide material to be deposited with excellent conformality.

A method of forming a metal chalcogenide material is disclosed, the method comprising introducing a metal precursor and a chalcogenide precursor into a chamber comprising a substrate. The metal precursor comprises a carboxylate of an alkali metal, an alkaline earth metal, a transition metal, a post-transition metal, or a metalloid. The chalcogenide precursor comprises a hydride, alkyl, or aryl precursor of sulfur, selenium, or tellurium or a silylhydride, silylalkyl, or silylaryl precursor of sulfur, selenium, or tellurium. The metal precursor and the chalcogenide precursor are reacted to form a metal chalcogenide material. The metal chalcogenide material excludes SbTe, GeTe, GeSbTe, ZnTe, BiTe, ZnSe, BiSe, InSe, and CuSe.

In some embodiments, the metal chalcogenide material is CuTe, which is formed by using copper(II) pivalate and bis(trimethylsilyl) telluride as the ALD precursors. During the ALD process, the copper(II) pivalate and bis(trimethylsilyl) telluride react with one another to form CuTe. The reaction is thermodynamically favorable and enables a low deposition temperature, such as room temperature, to be achieved. By forming the CuTe by ALD, the CuTe may be formed conformally.

A method of forming a metal chalcogenide material is disclosed, the method comprising reacting copper(II) pivalate with a chalcogenide precursor to form a copper telluride material on a substrate.

While the metal chalcogenide material has been described above as a binary compound, the metal chalcogenide materials may also be a ternary or quaternary compound. The metal chalcogenide material may include at least one additional element, such as another alkali metal, alkaline earth metal, transition metal, post-transition metal, or metalloid. The additional element may include, but is not limited to, Al, Sb, Bi, cadmium (Cd), chromium (Cr), Co, Cu, Ga, Ge, Au, hafnium (Hf), In, iron (Fe), Pb, manganese (Mn), mercury (Hg), Mo, Ni, Pd, platinum (Pt), Ag, Ta, Sn, Ti, tungsten (W), Zn, or zirconium (Zr). The additional element may also be a non-metal element(s), such as boron (B), nitrogen (N), oxygen (O), silicon (Si), phosphorus (P), or arsenic (As). The additional element(s) may affect the properties of the metal chalcogenide material, such as the ability to form the metal chalcogenide material in a crystalline form or an amorphous form. The additional element(s) may be selected to be compatible with the other metal and chalcogen elements during the ALD process.

Figure 3:
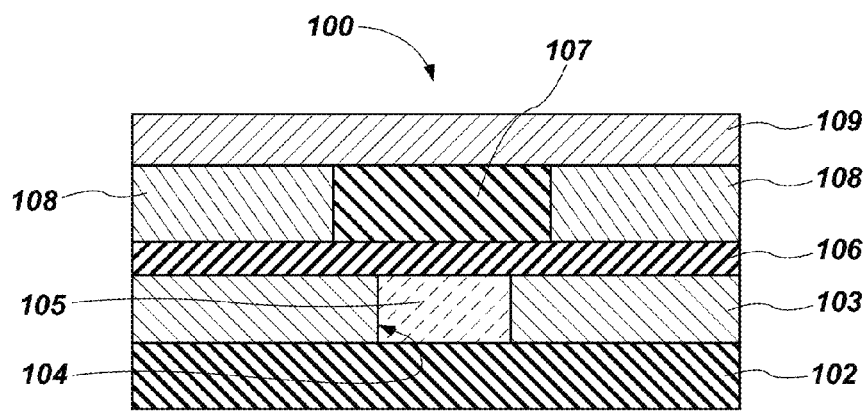
FIG. 3 illustrates a partial cross-sectional view of an embodiment of a memory cell according to the present disclosure.

The metal chalcogenide material may be used as an ion source material in a memory cell, such as in a conductive bridge RAM cell. An embodiment of a conductive bridge RAM cell 100 is illustrated in FIG. 3. The conductive bridge RAM cell 100 includes a first electrode 102, a dielectric material 103, a conductive material 105 disposed in at least one opening 104 in the dielectric material 103, an active material 106, an ion source material 107, an insulator 108, and a second electrode 109.

The first electrode 102 may include a conductive material, such as, for example, one or more of W, Ni, WN, TiN, TaN, polysilicon, and a metal silicide (e.g., $WSi_x$, $TiSi_x$, $CoSi_x$, $TaSi_x$, $MnSi_x$, where x is a rational number greater than zero). In some embodiments, the first electrode 102 may be a region of a semiconductor substrate doped so as to be electrically conductive. The first electrode 102 may be or be a part of a so-called "inert electrode" of a conductive bridge RAM cell. The dielectric material 103 may be positioned over the first electrode 102 to isolate at least portions of the first electrode 102 from the active material 106 positioned over the dielectric material 103. By way of example and not limitation, the dielectric material 103 may include at least one of silicon nitride (e.g., $Si_3N_4$) and silicon oxide (e.g., $SiO_2$). The dielectric material 103 may be any dielectric material configured to electrically isolate at least portions of the first electrode 102 from other materials formed over the dielectric material 103. The dielectric material 103 may have the opening 104 in which the conductive material 105 may be disposed for providing electrical contact between the first electrode 102 and the active material 106. The conductive material 105 may be the inert electrode contact of the conductive bridge RAM cell 100 and may include, by way of non-limiting example, one or more of W, Ni, WN, TiN, TaN, polysilicon, a metal silicide, etc.

The active material 106 may be positioned over the dielectric material 103 and in electrical contact with the first electrode 102 through the conductive material 105. The active material 106 may be an oxide material (e.g., an oxide glass), such as at least one of a transition metal oxide (e.g., $HfO_x$, $ZrO_x$, $WO_x$, etc.), a silicon oxide (e.g., $SiO_2$), an aluminum oxide (e.g., $Al_2O_3$), or a chalcogenide material (e.g., a chalcogenide glass). The chalcogenide material may include at least one of the chalcogen elements, such as sulfur (S), selenium (Se), and tellurium (Te). The ion source material 107 may be positioned over the active material 106 and may be electrically conductive. The ion source material 107 may include an active metal species (e.g., Cu or Ag) for providing metal ions that drift (i.e., diffuse) into the active material 106 upon application of a voltage across the conductive bridge RAM cell 100 to form a conductive bridge through the active material 106. The conductive bridge may be removed (by applying a voltage with reversed polarity across the electrodes) or may remain in place indefinitely without needing to be electrically refreshed or rewritten. The ion source material 107 may include the metal chalcogenide material and serves as the source of the Cu or Ag ions. In some embodiments, the ion source material 107 is CuTe. The ion source material 107 may be formed over the active material 106 and a portion removed, such as by dry etching, followed by formation of the insulator 108 adjacent to the ion source material 107. Alternatively, the insulator 108 may be formed over the active material 106 and an opening (not shown) formed therein. The opening may be filled with the ion source material 107. The length of the ion source material 107 may be the same as or greater than the length of the conductive material 105. The second electrode 109 may be positioned over the ion source material 107 and the insulator 108. The second electrode 109 may be formed of an active metal, such as silver or copper, or may be formed of a combination of a conductive ion source material and an inert metal cap of, for example, tungsten, titanium nitride, or tantalum nitride.

A memory cell is disclosed, the memory cell comprising a dielectric material over a first electrode, a conductive material in an opening in the dielectric material, an active material over the conductive material and the dielectric material, an ion source material conformally formed over the active material, and a second electrode over the ion source material. The ion source material comprises a metal chalcogenide material comprising Sb, Bi, Cu, Ga, Ge, Au, In, Pb, Ni, Pd, Ag, Sn, or Zn as the metal and sulfur, selenium, or tellurium as the chalcogen. The metal chalcogenide material excludes SbTe, GeTe, GeSbTe, ZnTe, BiTe, ZnSe, BiSe, InSe, and CuSe.

Figure 4A:
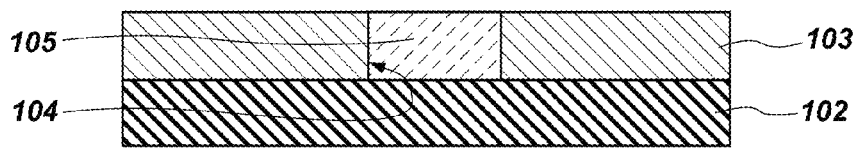
FIGS. 4A-4D illustrate an embodiment of a method of forming a memory cell, such as the memory cell of FIG. 3.

The conductive bridge RAM cell 100 may be formed by forming the first electrode 102 over or in a substrate (not shown), as shown in FIG. 4A. The formation of the first electrode 102 may be accomplished by conventional techniques and is, therefore, not described in detail in the present disclosure. The dielectric material 103 may be formed over the first electrode 102. The dielectric material 103 may be formed by conventional techniques and is, therefore, not described in detail in the present disclosure. The opening 104 may be formed in the dielectric material 103 by conventional methods (e.g., photolithography) and at least partially filled with the conductive material 105 (e.g., TiN) to provide electrical connection between the first electrode 102 and the active material 106. The conductive material 105 may be formed in the opening 104 and planarized (e.g., by chemical mechanical planarization).

Figure 4B:
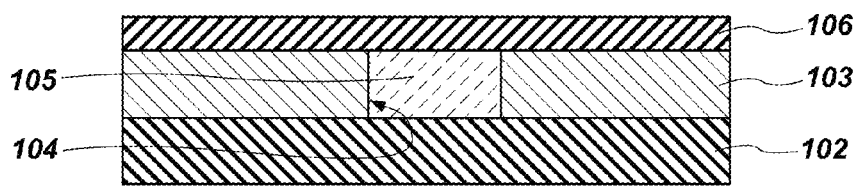

As shown in FIG. 4B, the active material 106 may be formed over the dielectric material 103 and the conductive material 105. The active material 106 may be configured to enable metal ions to move (i.e., drift) therein responsive to a voltage applied across the active material 106. The active material 106 may be formed by conventional methods known in the art and, therefore, is not described herein in detail. By way of example and not limitation, the active material 106 may be formed by at least one of PVD, CVD, and ALD techniques.

Figure 4C:
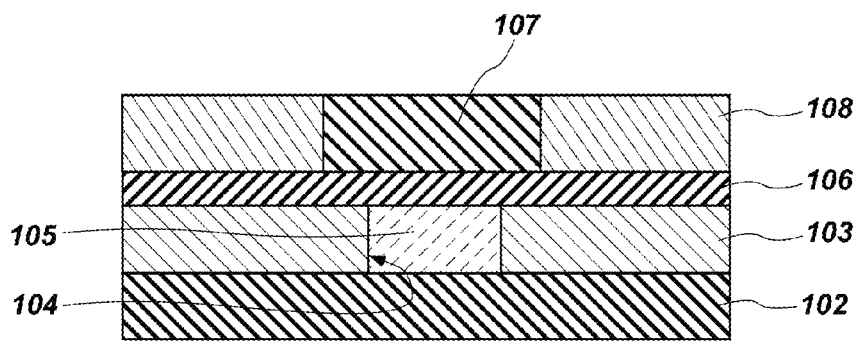
Figure 4D:
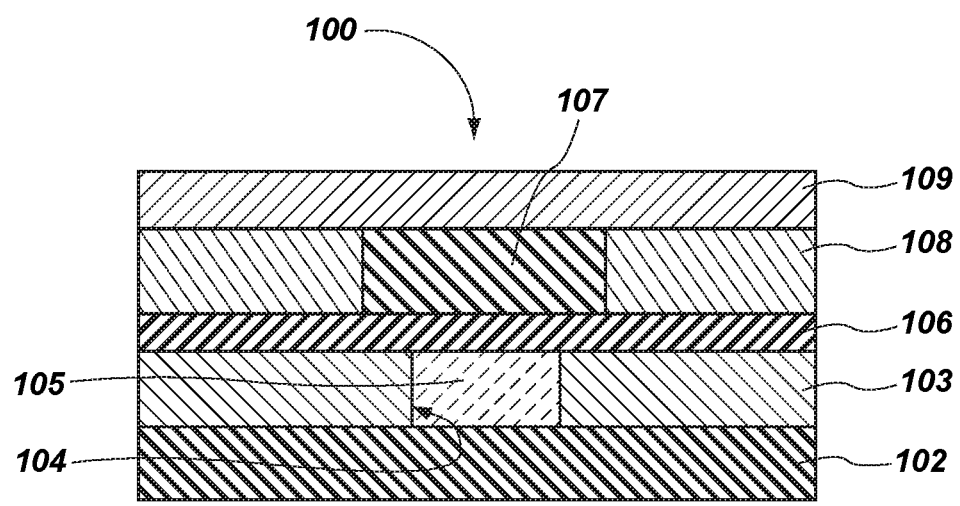

As shown in FIG. 4C, the ion source material 107 may be formed over the active material 106. The ion source material 107 may be formed by ALD as previously described. Since an ALD process may be used to form the ion source material 107, the ion source material 107 may be conformally deposited over the active material 106. A portion of the ion source material 107 may be removed, such as by dry etching, followed by formation of the insulator 108 adjacent to the ion source material 107. Alternatively, the insulator 108 may be formed over the active material 106 and an opening (not shown) formed therein. The opening may be filled with the ion source material 107. The second electrode 109 may be formed over the ion source material 107 and insulator 108, as shown in FIG. 4D, producing conductive bridge RAM cell 100.

A method of forming a memory cell is disclosed, the method comprising forming a dielectric material over a first electrode. A conductive material is formed in an opening in the dielectric material. An active material is formed over the conductive material and the dielectric material. An ion source material is formed by atomic layer deposition over the active material. A second electrode is formed over the ion source material.

By forming the metal chalcogenide material according to embodiments of the present disclosure, a highly conformal and pure metal chalcogenide material may be produced. The methods of the present disclosure enable the formation of the metal chalcogenide material at a temperature at or near room temperature. The memory cells including the metal chalcogenide material may be used in memory devices for wireless devices, personal computers, or other electronic devices.

The following example serves to explain embodiments of the present invention in more detail. This example is not to be construed as being exhaustive or exclusive as to the scope of the disclosure.

EXAMPLE 1

ALD Process for Forming CuTe

Figure 2:
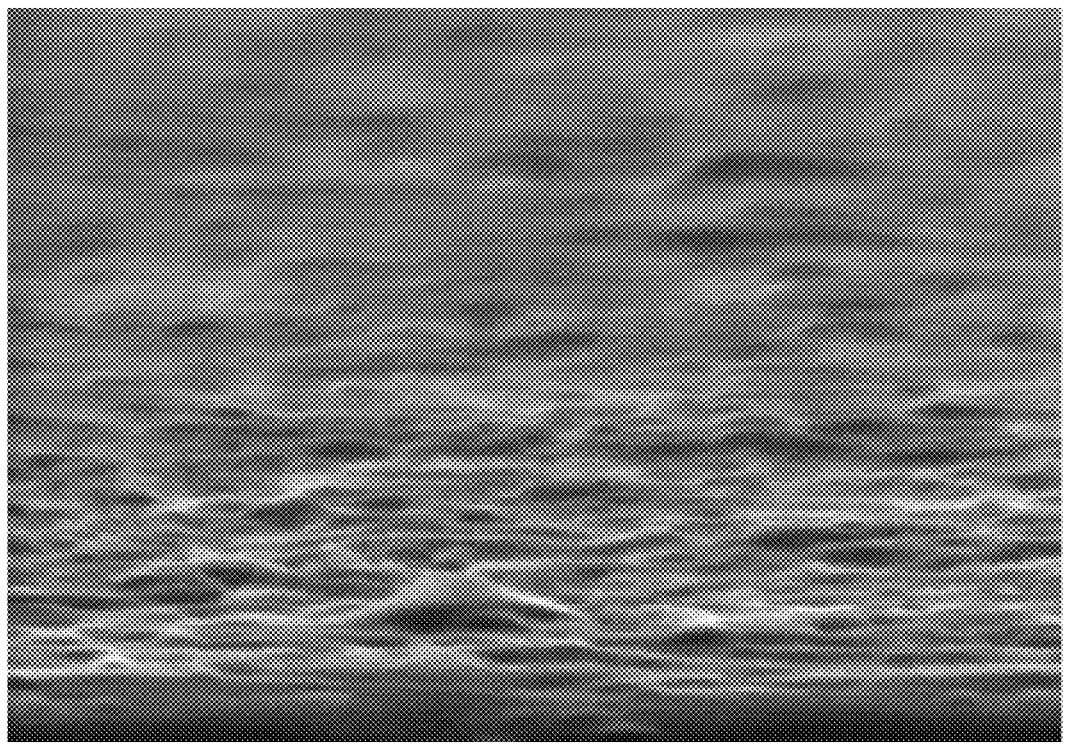
FIG. 2 is a scanning electron micrograph (SEM) of a metal chalcogenide material formed by an embodiment of the present disclosure.

CuTe was produced by an ALD process using copper(II) pivalate and bis(trimethylsilyl) telluride as the metal precursor and chalcogenide precursor, respectively. Copper(II) pivalate were introduced into the chamber at a temperature of 200° C. After purging for 30 seconds, bis(trimethylsilyl) telluride was introduced at $1 \times 10^{-3}$ Torr at a temperature of 200° C. The resulting material was analyzed by x-ray photoelectron spectroscopy (XPS). The XPS depth profile for the CuTe material is shown in FIG. 1, and demonstrates that the CuTe was highly pure, with carbon and oxygen impurities below detection limits. The CuTe was deposited as a substantially smooth material, as shown in FIG. 2.

The ALD process was conducted at various temperatures, ranging from room temperature to 250° C., i.e., at room temperature, 80° C., 125° C., 150° C., 200° C., and 250° C., to form the CuTe.

While Example 1 describes forming CuTe as the metal chalcogenide material, other metal chalcogenide materials may be formed in a similar manner by appropriately selecting the metal precursor and the chalcogenide precursor.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the following appended claims and their legal equivalents.

What is claimed is:

1. A method of forming a metal chalcogenide material, comprising:
    exposing a substrate to a metal precursor and a chalcogenide precursor, the metal precursor comprising a carboxylate of an alkali metal, an alkaline earth metal, a transition metal, a post-transition metal, or a metalloid and the chalcogenide precursor comprising a hydride, alkyl, or aryl precursor of sulfur, selenium, or tellurium or a silylhydride, silylalkyl, or silylaryl precursor of sulfur, selenium, or tellurium; and
    reacting the metal precursor and the chalcogenide precursor to form a metal chalcogenide material on the substrate, the metal chalcogenide material excluding SbTe, GeTe, GeSbTe, ZnTe, BiTe, ZnSe, BiSe, InSe, and CuSe.

2. The method of claim 1, wherein exposing a substrate to a metal precursor and a chalcogenide precursor comprises exposing the substrate to a metal precursor comprising a carboxylate of antimony (Sb), bismuth (Bi), copper (Cu), gallium (Ga), germanium (Ge), gold (Au), indium (In), lead (Pb), nickel (Ni), palladium (Pd), silver (Ag), tin (Sn), or zinc (Zn) and the chalcogenide precursor.

3. The method of claim 1, wherein exposing a substrate to a metal precursor and a chalcogenide precursor comprises exposing the substrate to the metal precursor and a chalcogenide precursor comprising $Te(R^1R^2)$, $Se(R^1R^2)$, $Te(SiR^3R^4R^5)_2$, or $Se(SiR^3R^4R^5)_2$, wherein each of $R^1$ and $R^2$ is an alkyl group having between two carbon atoms and four carbon atoms, and each of $R^3$, $R^4$, or $R^5$ is an alkyl group having between one carbon atom and six carbon atoms.

4. The method of claim 1, wherein exposing a substrate to a metal precursor and a chalcogenide precursor comprises exposing the substrate to the metal precursor and a chalcogenide precursor comprising bis(trimethylsilyl) telluride, bis(triethylsilyl) telluride, bis(diethylmethylsilyl) telluride, bis(dimethylethylsilyl) telluride, diethyl telluride, diisopropyl telluride, dibutyl telluride, or bis(t-butyl) telluride.

5. The method of claim 1, wherein reacting the metal precursor and the chalcogenide precursor to form a metal chalcogenide material on the substrate comprises forming antimony sulfide (SbS), antimony selenide (SbSe), germanium sulfide (GeS), germanium selenide (GeSe), zinc sulfide (ZnS), bismuth sulfide (BiS), indium sulfide (InS), indium telluride (InTe), copper sulfide (CuS), copper telluride (CuTe), silver sulfide (AgS), silver selenide (AgSe), silver telluride (AgTe), gold sulfide (AuS), gold selenide (AuSe), or gold telluride (AuTe) on the substrate.

6. The method of claim 1, wherein exposing a substrate to a metal precursor and a chalcogenide precursor comprises exposing the substrate to the metal precursor and the chalcogenide precursor at a temperature of from approximately 20° C. to approximately 25° C.

7. The method of claim 1, wherein exposing a substrate to a metal precursor and a chalcogenide precursor comprises exposing the substrate to the metal precursor and the chalcogenide precursor at a temperature of from approximately 20° C. to approximately 325° C.

8. The method of claim 1, wherein exposing a substrate to a metal precursor and a chalcogenide precursor comprises exposing the substrate to the metal precursor comprising a metal acetate, metal propionate, metal butyrate, metal isobutyrate, metal valerate, metal pivalate, or metal hexanoate and the chalcogenide precursor.

9. The method of claim 1, wherein exposing a substrate to a metal precursor and a chalcogenide precursor comprises sequentially exposing the substrate to the metal precursor and the chalcogenide precursor and sequentially forming monolayers of metal and monolayers of chalcogen.

10. The method of claim 1, further comprising including at least one additional element in the metal chalcogenide material.

11. The method of claim 10, wherein including at least one additional element in the metal chalcogenide material comprises including at least one of aluminum (Al), antimony (Sb), bismuth (Bi), cadmium (Cd), chromium (Cr), cobalt (Co), copper (Cu), gallium (Ga), germanium (Ge), gold (Au), hafnium (Hf), indium (In), iron (Fe), lead (Pb), manganese (Mn), mercury (Hg), molybdenum (Mo), nickel (Ni), palladium (Pd), platinum (Pt), silver (Ag), tantalum (Ta), tin (Sn), titanium (Ti), tungsten (W), zinc (Zn), zirconium (Zr), boron (B), nitrogen (N), oxygen (O), silicon (Si), phosphorus (P), or arsenic (As) in the metal chalcogenide material.

12. The method of claim 1, wherein exposing a substrate to a metal precursor and a chalcogenide precursor and reacting the metal precursor and the chalcogenide precursor to form a metal chalcogenide material on the substrate comprises forming the metal chalcogenide material by atomic layer deposition.

13. The method of claim 1, wherein reacting the metal precursor and the chalcogenide precursor to form a metal chalcogenide material on the substrate comprises forming the metal chalcogenide material over an active material on the substrate.

14. A method of forming a copper telluride material, comprising:
reacting copper(II) pivalate with a chalcogenide precursor to form a copper telluride material on a substrate.

15. The method of claim 14, wherein reacting copper(II) pivalate with a chalcogenide precursor comprises reacting copper(II) pivalate with bis(trimethylsilyl) telluride to form the copper telluride material.

16. The method of claim 14, wherein reacting copper(II) pivalate with a chalcogenide precursor comprises reacting copper(II) pivalate with diethyl telluride to form the copper telluride material.

17. The method of claim 14, wherein reacting copper(II) pivalate with a chalcogenide precursor to form a copper telluride material on a substrate comprises forming the copper telluride material by atomic layer deposition.

18. A method of forming a memory cell, comprising:
forming an opening in a dielectric material over a first electrode;
completely filling the opening in the dielectric material with a conductive material;
forming an active material directly on an exposed surface of the conductive material and on all exposed horizontal surfaces of the dielectric material;
forming an ion source material by atomic layer deposition over the active material; and
forming a second electrode over the ion source material.

19. The method of claim 18, wherein forming an ion source material by atomic layer deposition over the active material comprises forming a copper telluride material by atomic layer deposition.

20. The method of claim 18, wherein forming an ion source material by atomic layer deposition over the active material comprises:
introducing a metal precursor and a chalcogenide precursor into a chamber comprising the active material, the metal precursor comprising a carboxylate of an alkali metal, an alkaline earth metal, a transition metal, a post-transition metal, or a metalloid and the chalcogenide precursor comprising a hydride, alkyl, or aryl precursor of sulfur, selenium, or tellurium or a silylhydride, silylalkyl, or silylaryl precursor of sulfur, selenium, or tellurium; and
reacting the metal precursor and the chalcogenide precursor to form a metal chalcogenide material on the active material, the metal chalcogenide material excluding SbTe, GeTe, GeSbTe, ZnTe, BiTe, ZnSe, BiSe, InSe, and CuSe.

21. The method of claim 18, wherein forming an ion source material by atomic layer deposition over the active material comprises forming a copper telluride material over the active material.

22. The method of claim 18, wherein completely filling the opening in the dielectric material with a conductive material comprises forming the conductive material in the opening so that an entire surface of the conductive material is coplanar with the exposed surfaces of the dielectric material.

23. A method of forming a memory cell, comprising:
forming an opening in a dielectric material over a first electrode;
completely filling the opening in the dielectric material with a conductive material;
depositing an active material directly on an exposed surface of the conductive material and on exposed surfaces of the dielectric material;
forming an ion source material by atomic layer deposition over the active material, comprising:
introducing a metal precursor and a chalcogenide precursor into a chamber comprising the active material, the metal precursor comprising a carboxylate of an alkali metal, an alkaline earth metal, a transition metal, a post-transition metal, or a metalloid and the chalcogenide precursor comprising a hydride, alkyl, or aryl precursor of sulfur, selenium, or tellurium or a silylhydride, silyalky, or silylaryl precursor of sulfur, selenium, or tellurium; and
reacting the metal precursor and the chalcogenide precursor to form the ion souce material comprising a metal chalcogenide material on the active material, the metal chalcogenide material excluding SbTe, GeTe, GeSbTe, ZnTe, BiTe, ZnSe, BiSe, InSe, and CuSe; and
forming a second electrode over the ion source material.

24. The method of claim 23, wherein depositing an active material directly on an exposed surface of the conductive material and on exposed surface of the dielectric material comprises depositing the active material directly on the exposed surface of the conductive material and all the exposed surfaces of the dielectric material.

* * * * *

UNITED STATES PATENT AND TRADEMARK OFFICE
CERTIFICATE OF CORRECTION

PATENT NO. : 9,496,491 B2  
APPLICATION NO. : 13/476186  
DATED : November 15, 2016  
INVENTOR(S) : Eugene P. Marsh et al.

Page 1 of 1

It is certified that error appears in the above-identified patent and that said Letters Patent is hereby corrected as shown below:

On the Title Page  
In ITEM *Primary Examiner*:    change "Tran Tran" to --Trang Tran--

In the Specification  
Column 3, Line 61,    change "iso-butyl, tent-butyl)," to --iso-butyl, tert-butyl),--

In the Claims  
Claim 9, Column 11, Line 17,    change "chalicogenide" to --chalcogenide--  
Claim 23, Column 12, Line 55,    change "silyalky," to --silylalkyl,--  
Claim 23, Column 12, Line 58,    change "ion souce material" to --ion source material--  
Claim 24, Column 12, Line 66,    change "exposed surface of" to --exposed surfaces of--

Signed and Sealed this  
Tenth Day of January, 2017

Michelle K. Lee  
*Director of the United States Patent and Trademark Office*